(12) United States Patent
Choi et al.

(10) Patent No.: US 8,270,226 B2
(45) Date of Patent: Sep. 18, 2012

(54) MEMORY MODULE HAVING A PLURALITY OF PHASE CHANGE MEMORIES, BUFFER RAM AND NAND FLASH MEMORY

(75) Inventors: Jangseok Choi, Seoul (KR); Dongyang Lee, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 212 days.

(21) Appl. No.: 12/656,224

(22) Filed: Jan. 21, 2010

(65) Prior Publication Data

US 2010/0214813 A1    Aug. 26, 2010

(30) Foreign Application Priority Data

Feb. 26, 2009   (KR) ................. 10-2009-0016399

(51) Int. Cl.
*G11C 7/22* (2006.01)
(52) U.S. Cl. ............... 365/189.05; 365/51; 365/226; 365/191; 365/185.17

(58) Field of Classification Search ............. 365/189.05, 365/51, 226, 191, 185.17
See application file for complete search history.

(56) References Cited

U.S. PATENT DOCUMENTS

| | | | |
|---|---|---|---|
| 5,798,961 A * | 8/1998 | Heyden et al. ................. 365/52 |
| 2007/0168781 A1 * | 7/2007 | Sutardja et al. ............... 714/718 |
| 2007/0220227 A1 | 9/2007 | Long | |
| 2007/0255891 A1 | 11/2007 | Chow et al. | |
| 2008/0130353 A1 | 6/2008 | Liu et al. | |
| 2008/0195798 A1 | 8/2008 | Lee et al. | |

* cited by examiner

*Primary Examiner* — Thong Q Le
(74) *Attorney, Agent, or Firm* — Harness, Dickey & Pierce, P.L.C.

(57) ABSTRACT

A memory module comprises a plurality of main memories; a buffer RAM configured to temporarily store data being provided to or read from the main memories and to perform a buffer function between an external device and the main memories; and a NAND flash memory configured to store data of the buffer RAM during an interruption of power being supplied to the buffer RAM.

13 Claims, 5 Drawing Sheets

MEMORY MODULE HAVING A PLURALITY OF PHASE CHANGE MEMORIES, BUFFER RAM AND NAND FLASH MEMORY

CROSS-REFERENCE TO RELATED APPLICATIONS

A claim of priority under 35 U.S. §119 is made to Korean Patent Application No. 10-2009-0016399, filed Feb. 26, 2009, the entire contents of which are incorporated herein by reference.

BACKGROUND

1. Field

Example embodiments of the inventive concepts relate to a memory module.

2. Related Art

Memory modules applied to computers, servers, and workstations may include various parts and a number of memory chips which are placed on printed circuit boards. In recent years, research has been performed on memory modules using a phase change memory. As a new memory which may be capable of replacing a NOR flash memory, the phase change memory may be rewritable without deleting/erasing previously written/programmed/stored data. A write speed of the phase change memory may be about thirty times faster than that of a conventional flash memory. Further, the phase change memory may be advantageous in terms of performance, stability, and cost as compared with the NOR flash memory.

SUMMARY

One aspect of example embodiments of the inventive concepts may provide a memory module which comprises a plurality of main memories; a buffer RAM configured to temporarily store data being provided to or read from the main memories and to perform a buffer function between an external device and the main memories; and a NAND flash memory configured to store data of the buffer RAM during an interruption of power being supplied to the buffer RAM.

Another aspect of example embodiments of the inventive concepts may provide a memory module comprising one or more memory sets, each of the memory sets including a plurality of phase change memories, a buffer RAM configured to temporarily store data being provided to or read from the plurality of phase change memories and to perform a buffer function between an external device and the plurality of phase change memories, and a NAND flash memory configured to store data of the buffer RAM during an interruption of power being supplied to the buffer RAM, the buffer RAM being connected with the external device via a data line.

BRIEF DESCRIPTION OF THE FIGURES

The above and other features and advantages of example embodiments of the inventive concepts will become more apparent by describing in detail example embodiments of the inventive concepts with reference to the attached drawings. The accompanying drawings are intended to depict example embodiments of the inventive concepts and should not be interpreted to limit the intended scope of the claims. The accompanying drawings are not to be considered as drawn to scale unless explicitly noted.

DETAILED DESCRIPTION OF THE EMBODIMENTS

Figure 1:
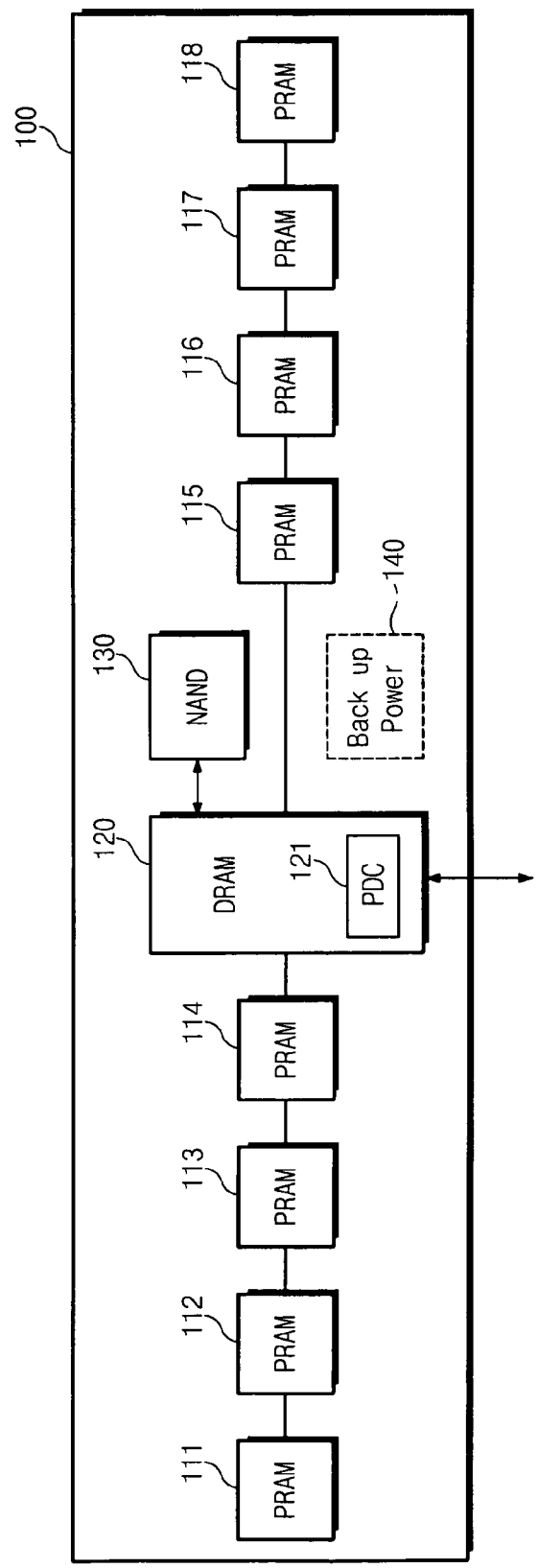
FIG. 1 is a schematic block diagram showing a memory module according to example embodiments of the inventive concepts.

Detailed example embodiments of the inventive concepts are described more fully hereinafter with reference to the accompanying drawings, in which embodiments of the inventive concept are shown. Example embodiments of the inventive concepts may, however, be embodied in many different forms and should not be construed as limited to the embodiments set forth herein. Rather, these embodiments are provided so that this disclosure will be thorough and complete, and will fully convey the scope of example embodiments of the inventive concepts to those skilled in the art. In the drawings, the size and relative sizes of layers and regions may be exaggerated for clarity. Like numbers refer to like elements throughout.

Accordingly, while example embodiments of the inventive concepts are capable of various modifications and alternative forms, embodiments thereof are shown by way of example in the drawings and will herein be described in detail. It should be understood, however, that there is no intent to limit example embodiments of the inventive concepts to the particular forms disclosed, but to the contrary, example embodiments of the inventive concepts are to cover all modifications, equivalents, and alternatives falling within the scope of example embodiments of the inventive concepts.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the scope of example embodiments of the inventive concepts.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of example embodiments of the inventive concepts. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

A memory module according to example embodiments of the inventive concepts may be configured as a buffer RAM which performs a buffer function between a main memory and an external device. This may make it possible to improve characteristics, for example speed, of a write operation of a main memory whose write speed is relatively slow.

FIG. 1 is a schematic block diagram showing a memory module according to example embodiments of the inventive concepts.

Referring to FIG. 1, a memory module 100 may include a plurality of main memories 111~118, DRAM 120, a NAND flash memory 130, and a back-up power supply 140. The DRAM 120 of the memory module 100 may be used to perform a buffer function between the main memories 111~118 and an external device and to store frequently accessed data, for example a boot code.

The main memories 111~118 and the DRAM 120 of the memory module 100 may be realized on the same printed circuit board.

The main memories 111~118 may form a data storing space which stores externally provided data. The main memories 111~118 may be formed of a phase change memory (PRAM), respectively. But, it is well comprehended that the main memories 111~118 may be implemented using memory types other than the phase change memory. Any types of memory configured to store data may be used as the main memories 111~118. For example, the main memories 111~118 may be realized by Ferroelectric RAM, Magnetic RAM, Resistive RAM, Nanocrystal Floating Gate Memory (NFGM), or the like.

Memory cells of the phase change memory may each include a phase change material, respectively. The phase change material may be set to one of at least two physical states (or, two or more physical states). It is possible to store data in each memory cell according to physical states. For example, a high resistance state of the phase change material may correspond to data 0, and a low resistance state may correspond to data 1.

The phase change memory may be a non-volatile memory which is configured to support a random access function. The phase change memory may perform a read operation relatively quickly as compared with a NAND flash memory. Further, using the phase change memory may be more profitable due to a shorter fabrication process as compared with DRAM because the phase change memory utilizes phase change to store data. Accordingly, the phase change memory may have desirable cost and data capacity attributes as compared with DRAM.

FIG. 1 illustrates an example in which the memory module 100 includes eight main memories 111~118. However, the number of main memories in the memory module 100 is not limited to this disclosure. For example, the memory module 100 may be configured to include one or more main memories.

A write speed of the phase change memory may be slower than that of SRAM or DRAM. Further, the write speed of the phase change memory may be slower than a read speed of the phase change memory. For this reason, externally provided data may be stored in a main memory, a phase change memory, via the DRAM 120, instead of being stored directly in a main memory.

The DRAM 120 may perform a buffer function between the main memories 111~118 and an external device (for example, an external or internal memory controller). Frequently accessed data such as the boot code may be stored in the DRAM 120. According to example embodiments of the inventive concepts, the boot code may be stored in the DRAM 120, and not in a main memory. Accordingly, the DRAM 120 may perform a function that may normally be performed by a main memory.

During a write operation of the memory module 100, externally generated data received by the memory module 100 may be stored in the DRAM 120. Afterwards, data stored in the DRAM 120 may be provided to a main memory corresponding to an input address in response to an external output command. Alternatively, data stored in the DRAM 120 may be provided to a main memory corresponding to an input address after a period of time elapses.

Externally generated addresses and commands received by the memory module 100 may be transferred to the main memories 111~118 and the DRAM 120 via at least one line which is shared by the main memories 111~118 and the DRAM 120. In this case, the DRAM 120 and the main memories 111~118 may be configured to have the same interface architecture.

Alternatively, externally generated addresses and commands being input into memory module 100 may be provided to the DRAM 120, and then they may be converted so as to be suitable for an interface of the main memories 111~118. The conversion may be performed by a main memory interface (not shown) within the DRAM 120. Converted addresses and commands may be sent to a main memory corresponding to an input address.

The memory module 100 according to example embodiments of the inventive concepts may be configured to send data from a main memory directly to an external device without passing the DRAM 120, during a read operation. According to example embodiments of the inventive concepts, data output lines of the main memories 111~118 may be connected directly with an external device, not connected with the DRAM 120. Further, at least two main memories may share data output lines.

Alternatively, the DRAM 120 may be configured to temporarily store data read out from a main memory corresponding to an input address and to output the temporarily stored data to an external device, at a read operation.

The DRAM 120 may include a bypass function. A ratio of a read speed to a write speed of a main memory may be, for example, at or around 3:2. Accordingly, the DRAM 120 may perform a bypass function during a read operation to increase the bus efficiency. According to example embodiments of the inventive concepts, data read out from a main memory may be passed directly to an external device through the DRAM 120 without being stored in the DRAM 120. For example, the DRAM 120 may connect data output lines between the main memories and the DRAM 120 directly to an external device.

The DRAM 120 may be used to store frequently accessed codes. For example, a computing system (not shown) including the memory module 100 may store frequently accessed data in the DRAM 120, and not in the main memories 111~118. On the other hand, data not frequently accessed may be stored in the main memories 111~118.

The DRAM 120 may include a power detecting circuit 121. The power detecting circuit 121 may sense a level of a power supply voltage applied to the memory module 100. The power detecting circuit 121 may generate a flag signal when a power level is reduced to a given level at interruption of a power supply voltage.

The NAND flash memory 130 may be configured to perform a backup function in response to the flag signal generated by the DRAM 120. The flag signal may include a write command of the NAND flash memory 130. Data stored in the DRAM 120 may be sent to the NAND flash memory 130 according to generation of the flag signal. The NAND flash memory 130 may store data sent from the DRAM 120.

The NAND flash memory 130 may be used to back up data stored in the DRAM 120 during an interruption of a power supply voltage from an external device. According to example embodiments of the inventive concepts, the NAND flash memory 130 may prevent data in the DRAM 120 from being lost when a power supply voltage applied to the DRAM 120 performing a buffer function is suddenly cut off. The NAND flash memory 130 may store data (including addresses) stored in the DRAM 120 in response to the flag signal sent from the power detecting circuit 121 of the DRAM 120. Since a write characteristic of the NAND flash memory 130 may be good as compared with the phase change memory, the NAND flash memory 130 may be used to back up data stored in the DRAM 120 during a given time when an abnormal power interruption occurs.

The back-up power supply 140 may maintain a power supply voltage during several seconds or several tens □ at power interruption of the memory module 100. The back-up power supply 140 may use a back-up battery.

Below, a write operation of the memory module 140 will be more fully described with reference to FIG. 1.

A write command, an address, and data may be sent to the memory module 100 from an external device (for example, a memory controller or a computer system). It is assumed that the write command and addresses are transferred simultaneously to the DRAM 120 and the main memories 111~118 via at least one shared line. The data may be stored in the DRAM 120 first. The DRAM 120 may provide the stored data to any one of the main memories 111~118 corresponding to an address after a given time or in response to a data output command (for example, IDLE time information) from an external device. Afterwards, any one of the main memories 111~118 corresponding to an address may store data from the DRAM 120 based on the write command and addresses.

Below, a read operation of the memory module 140 will be more fully described with reference to FIG. 1.

A read command and an address may be provided to the memory module 100. At this time, the read command and the address may be transferred directly to the main memories 111~118. Any one of the main memories 111~118 corresponding to the address may perform a read operation. Data read out from any one main memory may be provided directly to an external device without passing the DRAM 120. Additionally, data read out from any one main memory may be passed through the DRAM 120 and provided to an external device without being stored in the DRAM 120.

As described above, the memory module 100 according to example embodiments of the inventive concepts may use the DRAM 120, which may perform a buffer function between the main memories 111~118 and an external device. However, in addition to a DRAM device, various other types of buffer RAM may be used to perform a buffer function between the main memories 111~118 and an external device.

The memory module 100 according to example embodiments of the inventive concepts may improve a characteristic of a write operation by providing the DRAM 120 for performing a buffer function between the main memories 111~118 and an external device.

The following backup process may be made when a power supply voltage is again supplied after interruption of a power supply voltage in a computing system including the memory module 100. In the event that a power is resumed, the computing system may judge whether data is stored in the NAND flash memory 130. If data is stored in the NAND flash memory 130, data (including addresses) stored in the NAND flash memory 130 may be moved into the DRAM 120. The computing system may transfer data stored in the DRAM 120 to a main memory corresponding to the address. After data backup is ended and the data stored in the NAND flash memory 130 is transferred to the DRAM 120, the computing system may erase all data in the NAND flash memory 130.

Figure 2:
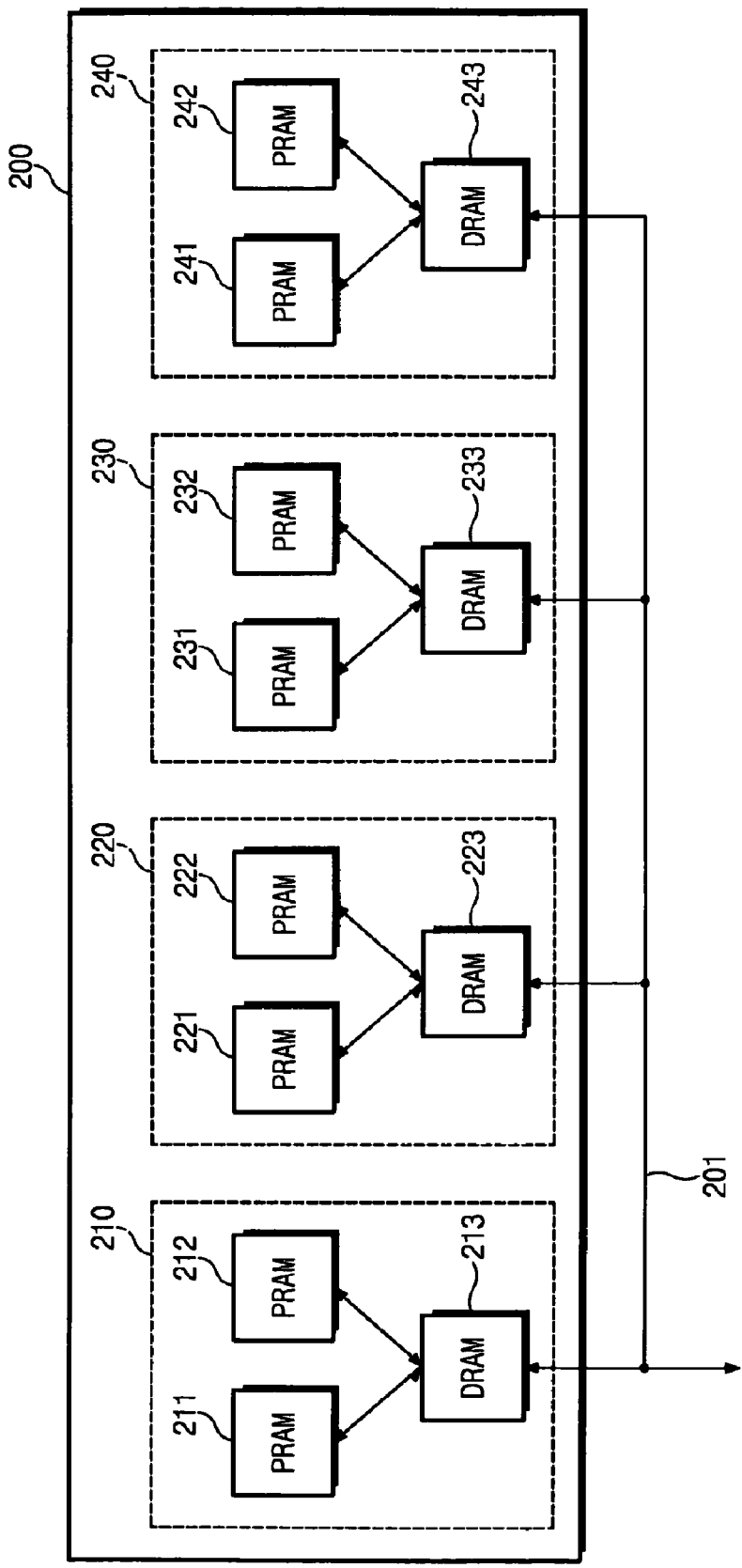
FIG. 2 is a schematic block diagram showing a memory module according to example embodiments of the inventive concepts.

FIG. 2 is a schematic block diagram showing a memory module according to the example embodiments of the inventive concepts.

Referring to FIG. 2, a memory module 200 may include a plurality of memory sets 210, 220, 230, and 240. The memory sets 210, 220, 230, and 240 may include DRAM 213, 223, 233, and 243 each performing a buffer function between an external device and a main memory, respectively.

For example, the first memory set 210 may include two main memories 211 and 212 and DRAM 213. The main memories 211 and 212 may be configured identically to main memories in FIG. 1. The DRAM 213 may perform a buffer function between an external device and the main memories 211 and 212.

DRAM 213, 223, 233, and 243 in the respective memory sets 210, 220, 230, and 240 may share at least one data line 201 connected with an external device.

Figure 3:
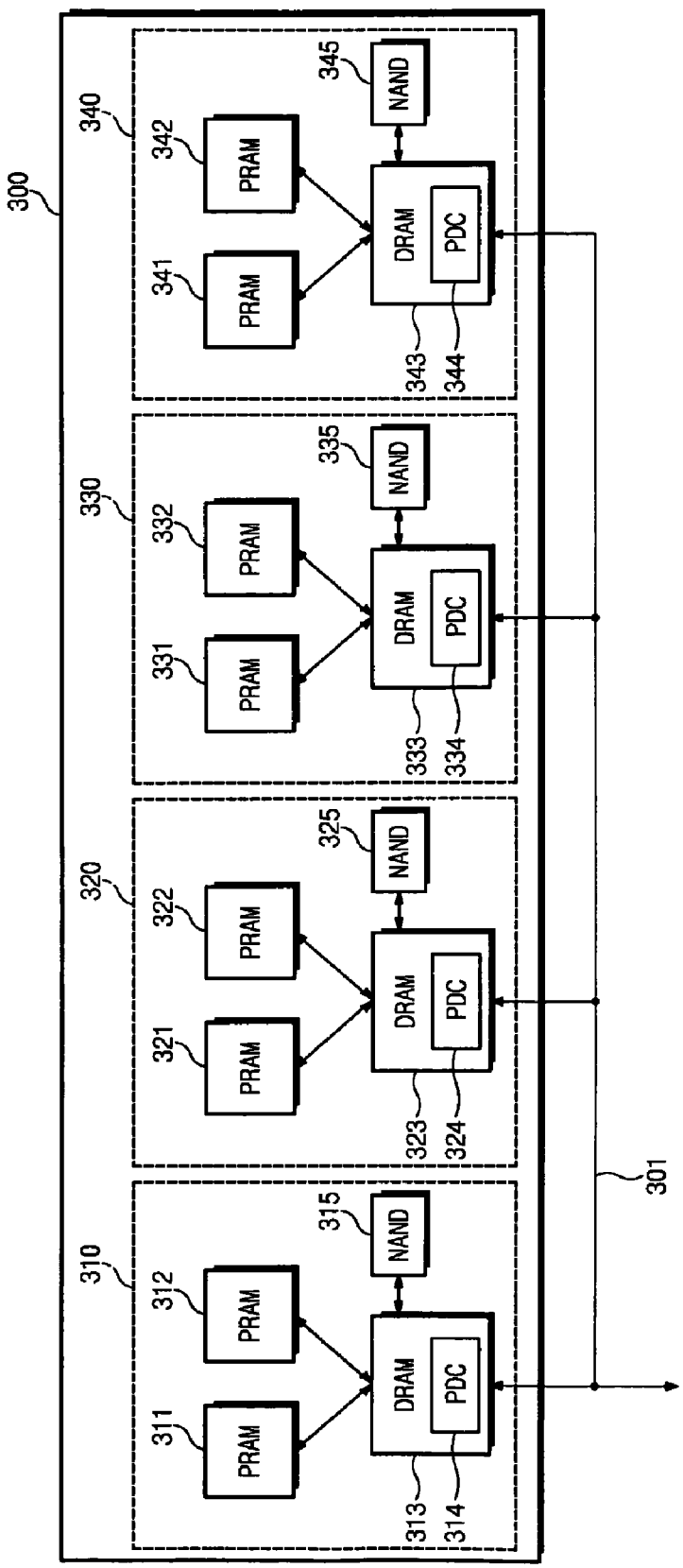
FIG. 3 is a schematic block diagram showing a memory module according to example embodiments of the inventive concepts.

FIG. 3 is a schematic block diagram showing a memory module according to example embodiments of the inventive concepts.

Referring to FIG. 3, a memory module 300 may include a plurality of memory sets 310, 320, 330, and 340. The memory sets 310, 320, 330, and 340 may include DRAM 313, 323, 333, and 343 each performing a buffer function between an external device and a main memory, respectively. The memory sets 310, 320, 330, and 340 may further include NAND flash memories 315, 325, 335, and 345 each backing up data stored in a corresponding DRAM at power interruption.

Below, the configuration and operation of memory sets 310, 320, 330 and 340 of memory module 300 will be described using the first memory set 310 as an example.

The first memory set 310 may include two main memories 311 and 312, DRAM 313, and a NAND flash memory 315. The main memories 311 and 312 may be configured substantially identically to main memories 111~118 in FIG. 1. The DRAM 313 may be configured substantially identically to DRAM 120 in FIG. 1. The DRAM 313 may include a power detecting circuit 314 which may be configured to sense an external power supply voltage level provided to the memory module 300. The NAND flash memory 315 may back up data stored in the DRAM 313 according to a sense result of the power detecting circuit 315. The NAND flash memory 315 may be configured substantially identically to a NAND flash memory 130 in FIG. 1.

Figure 4:
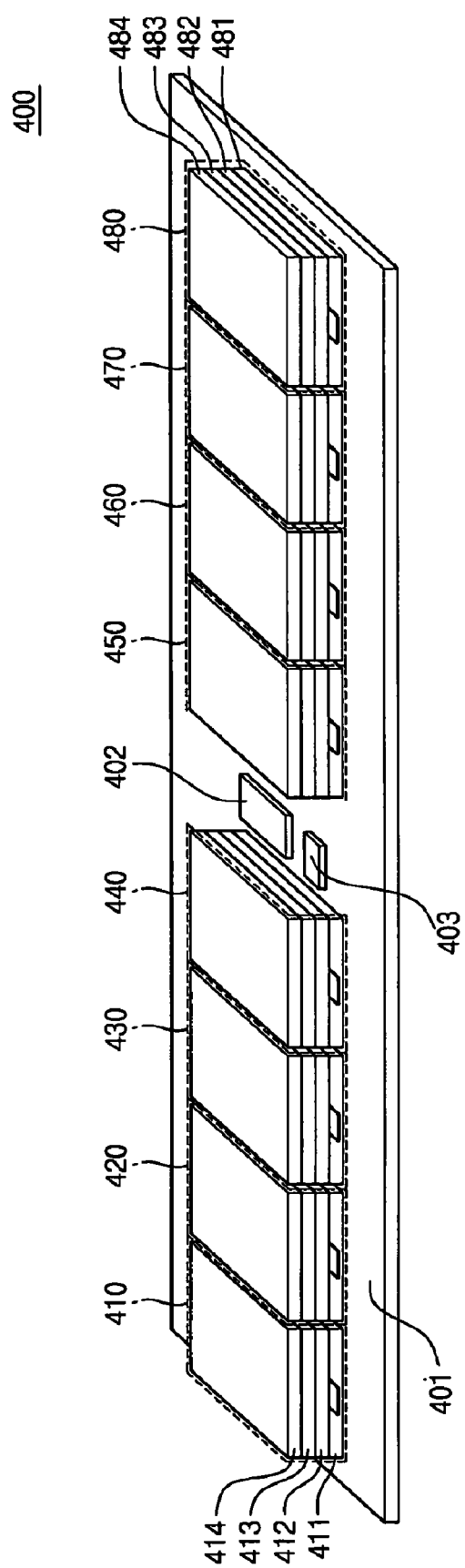
FIG. 4 is a schematic block diagram showing a memory module according to example embodiments of the inventive concepts.

FIG. 4 is a schematic block diagram showing a memory module according to example embodiments of the inventive concepts.

Referring to FIG. 4, a memory module 400 may include a substrate 401, a power detecting circuit 402, a NAND flash memory 403, and a plurality of memory sets 410~480. Each of the memory sets 410~480 may include a DRAM and main memories stacked on the DRAM.

For example, the first memory set 410 may include DRAM 411 placed on the substrate 401 and the first to third main memories 412, 413, and 414 may be sequentially stacked on the DRAM 411 in this order. The number of main memories stacked on the DRAM 411 is not limited to this disclosure. For example, the memory set 410 may include one or more main memories on the DRAM 411. The first memory set 410 may be realized using, for example, through silicon via (TSV).

The power detecting circuit 402 may sense a voltage level of a power supply voltage applied from an external device and determine whether or not to perform a backup function according to the sense result. The NAND flash memory 403 may be used to back up data stored in each DRAM of the memory sets according to the sense result of the power detecting circuit 403, that is, when a power supply is interrupted. Although not shown in figures, a back-up power supply may be further provided for supplying a power to the memory module 400 during a given time when the sense result indicates interruption of a power supply voltage.

Figure 5:
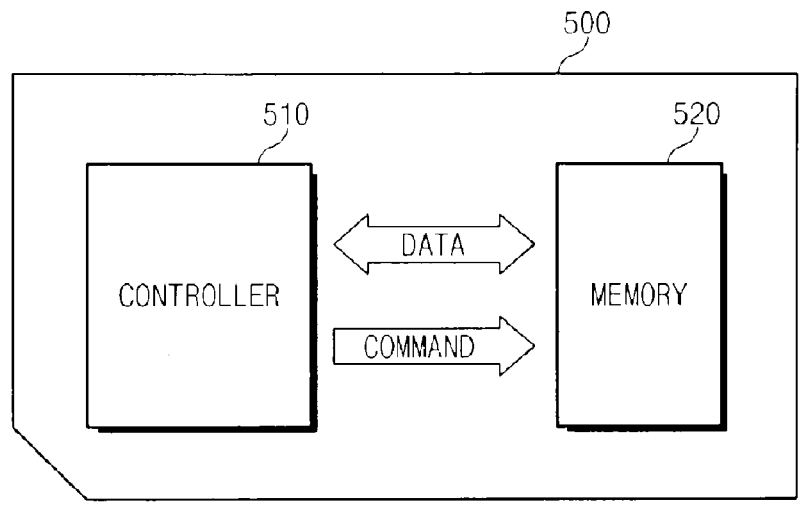
FIG. 5 is a schematic diagram roughly illustrating a memory card 500 according to example embodiments of the inventive concepts.

FIG. 5 is a schematic diagram illustrating a memory card 500 according to example embodiments. Referring to FIG. 5, a controller 510 and a memory 520 may exchange electric signals. For example, according to commands of the controller 510, the memory 520 and the controller 510 may exchange data. Accordingly, the memory card 500 may either store data in the memory 520 or output data from the memory 520. The memory 520 may include one of the non-volatile memory modules described above in reference to FIGS. 1 through 4.

Such a memory card 500 may be used as a storage medium for various portable electronic devices. For example, the memory card 500 may be a multimedia card (MMC) or a secure digital (SD) card.

Figure 6:
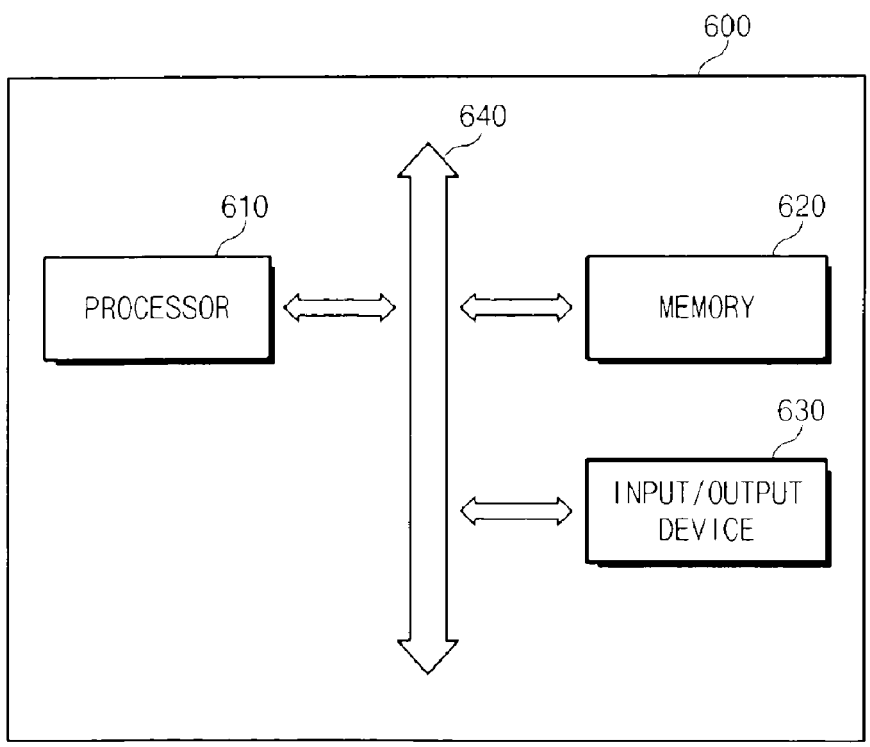
FIG. 6 is a block diagram roughly illustrating an electronic system 600 according to example embodiments of the inventive concepts.

FIG. 6 is a block diagram roughly illustrating an electronic system 600 according to example embodiments. Referring to FIG. 6, a processor 610, an input/output device 630, and a memory 620 may perform data communication with each other by using a bus 640. The processor 610 may execute a program and control the electronic system 600. The input/output device 630 may be used to input/output data to/from the electronic system 600. The electronic system 600 may be connected to an external device, e.g. a personal computer or a network, by using the input/output device 630 and may exchange data with the external device.

The memory 620 may store codes or programs for operations of the processor 610. For example, the memory 620 may include one of the non-volatile memory modules described above in reference to FIGS. 1 through 4.

For example, such an electronic system 600 may embody various electronic control systems requiring the memory 620, and, for example, may be used in mobile phones, MP3 players, navigation devices, solid state disks (SSD), or household appliances.

Example embodiments of the inventive concepts were described using examples of memory modules in FIGS. 1 to 6. However, example embodiments of the inventive concepts are not limited to the examples illustrated in FIGS. 1-6. For example, example embodiments of the inventive concepts may be applied to any memory which includes main memories and a DRAM performing a buffer function between the main memories and an external device.

A DRAM of a memory module according to example embodiments of the inventive concepts may be configured to mix a signal indicating a power level and a signal indicating a normal operation and generate a self-refresh command flag as a mixing result.

Example embodiments of the inventive concepts having thus been described, it will be obvious that the same may be varied in many ways. Such variations are not to be regarded as a departure from the intended spirit and scope of example embodiments of the inventive concepts, and all such modifications as would be obvious to one skilled in the art are intended to be included within the scope of the following claims.

What is claimed is:

1. A memory module comprising:
a plurality of main memories;
a buffer RAM configured to temporarily store data being provided to or read from the plurality of main memories and to perform a buffer function between an external device and the plurality of main memories;
a NAND flash memory configured to store data of the buffer RAM during an interruption of power being supplied to the buffer RAM; and
a backup power supply configured to supply a power during an interruption of power to the memory module,
wherein the plurality of main memories are each formed of one selected from a group of PRAM, MRAM, FRAM, and RRAM.

2. The memory module of claim 1, wherein the buffer RAM includes a power detecting circuit which is configured to sense a power supply voltage of the memory module and to generate a flag signal if the power being supplied to the buffer RAM is interrupted.

3. The memory module of claim 2, wherein the NAND flash memory is configured to perform a backup operation by storing the data of the buffer RAM based on the flag signal.

4. The memory module of claim 3, wherein the NAND flash memory is configured to transfer the data stored in the NAND flash memory to the buffer RAM, and erase the data stored in the NAND flash memory after power being supplied to the memory module is restored.

5. The memory module of claim 1, wherein the buffer RAM is configured to perform a bypass function by passing data read during a read operation directly into the external device without storing the data read during the read operation in the buffer RAM.

6. The memory module of claim 1, wherein the buffer RAM is configured to store a boot code and the boot code is not stored in the plurality of main memories.

7. A memory device, the memory device comprising:
one or more memory sets, each of the one or more memory sets including the memory module of claim 1, wherein for each of the one or more memory sets, the plurality of main memories is a plurality of phase change memories, and the buffer RAM is connected with the external device via a data line.

8. The memory module of claim 7, wherein the data line is a shared line connected to the buffer RAMs of each of the one or more memory sets, respectively.

9. The memory module of claim 7, further comprising a power detecting circuit which is configured to sense a power supply voltage of the memory module, and to generate a flag signal if power being supplied to the buffer RAM is interrupted.

10. The memory module of claim 6, wherein the NAND flash memory is configured to store the data of the buffer RAM based on the flag signal.

11. The memory module of claim 6, wherein the NAND flash memory is configured to transfer the data stored in the NAND flash memory to the buffer RAM, and erase the data stored in the NAND flash memory after power being supplied to the memory module is restored.

12. The memory module of claim 9, further comprising a backup power supply configured to supply power to the memory module during an interruption of power being supplied to the memory module.

13. The memory module of claim 6, wherein the plurality of phase change memories is stacked on the buffer RAM.

* * * * *